United States Patent [19]

Medernach et al.

[11] 4,371,598

[45] Feb. 1, 1983

[54] METHOD FOR FABRICATING ALIGNED PATTERNS ON THE OPPOSED SURFACES OF A TRANSPARENT SUBSTRATE

[75] Inventors: John W. Medernach, Albuquerque, N. Mex.; Ivan A. Novak, Glen Ellyn; Harry D. Bush, Palatine, both of Ill.

[73] Assignee: Motorola, Inc., Schaumburg, Ill.

[21] Appl. No.: 280,593

[22] Filed: Jul. 6, 1981

[51] Int. Cl.$^3$ .............................................. C03C 5/00
[52] U.S. Cl. ..................................... 430/22; 430/311; 430/313; 430/317; 430/318; 430/319; 430/329
[58] Field of Search ................ 430/22, 394, 396, 311, 430/312, 313, 314, 317, 318, 319, 320, 321–326, 329

[56] References Cited

U.S. PATENT DOCUMENTS 3,240,601 3/1966 Stalnecker et al. .............. 430/317
3,313,626 4/1967 Whitney ............................ 430/302
3,447,924 6/1969 Trzyna et al. ..................... 430/22
3,760,471 9/1973 Börner .............................. 430/314
4,254,210 3/1981 Van Stappen ..................... 430/394

OTHER PUBLICATIONS

Yashiro et al., A New Method of Specimen Preparation for FIM and FEM, 1977, Surface Science 67, No. 2, Oct. pp. 605–610.
"Double-Sided Photolithography", by Heinz, Chuss, Schroeder, Solid State Technology, Aug. 1978, pp. 55–60.

Primary Examiner—Mary F. Downey
Attorney, Agent, or Firm—Mark P. Kahler; Edward M. Roney; James W. Gillman

[57] ABSTRACT

A method is provided for fabricating substantially vertically aligned patterns of material on the opposed surfaces of a transparent substrate by employing a single external mask.

4 Claims, 10 Drawing Figures

METHOD FOR FABRICATING ALIGNED PATTERNS ON THE OPPOSED SURFACES OF A TRANSPARENT SUBSTRATE

BACKGROUND OF THE INVENTION

This invention relates generally to photolithographic generation of selected patterns on substrate materials, and more particularly to the photolithographic generation of aligned patterns on opposed surfaces of transparent materials.

DESCRIPTION OF THE PRIOR ART

To photolithographically produce metallic electrode patterns on transparent materials or other materials in the conventional manner, a layer of metal is deposited on one surface of a substrate and coated with a layer of photoresist. A mask exhibiting the desired selected pattern is placed in contact with the photoresist layer. The mask with the substrate-photoresist structure below is then subjected to ultraviolet light which causes the portions of the photoresist unshaded by the mask to polymerize and become hardened. The unhardened portions of the photoresist are then removed and the remaining structure is subjected to an etchant which removes the portion of the metallic layer unprotected by the hardened photoresist. A metallic pattern substantially identical to the mask pattern then remains on the surface of the transparent substrate. It is seen that conventional photolithographic techniques perform well in fabricating a selected metal electrode pattern on a single surface of a transparent material.

However, numerous difficulties are encountered when attempting to fabricate the same electrode pattern on both sides of a transparent substrate by photolithography. Such identical double-sided electrodes are often desirable on the opposed surfaces of electro-optic devices such as those made of PLZT (lanthanum doped lead zirconate titanate) substrates, a substantially transparent material. One technique for fabricating identical electrode structures on the opposed surfaces of a transparent substrate in which the electrode patterns are vertically aligned involves scribing each of the opposed surfaces at points vertically aligned with each other. Identical masks are then situated on each of the opposed surfaces of the substrate at positions determined with respect to the scribed points. Due to tolerance and measurement difficulties in attempting to scribe precisely vertically aligned points on the substrate, such points are typically not exactly vertically aligned resulting in somewhat misaligned mask structures on each opposed surface. The resultant electrode patterns on each of the opposed substrate surfaces are thus not precisely vertically aligned.

Another technique for fabricating aligned electrode patterns on the opposed surfaces of a transparent substrate involves drilling alignment holes through the substrate. The respective masks to be placed on each substrate surface are then aligned with respect to such holes. Unfortunately, such a drilling technique when applied to an inherently fragile transparent material such as PLZT often results in structural damage to the substrate material.

Yet another technique for fabricating the same electrode pattern on each side of a transparent substrate and for aligning such electrode patterns vertically involves a beam splitter which splits a beam of light from a common source into two paths. By employing appropriately arranged mirrors, light rays traveling along each of the first and second paths are caused to strike the first and second opposed surfaces of the substrate, respectively. Although this technique results in light from a common source striking each of the opposed substrate surfaces, a separate mask is still required for each of the two substrate surfaces. The vertical alignment problems referred to above thus still remain in this technique.

It is one object of the present invention to fabricate precisely vertically aligned identical electrode patterns on the opposed surfaces of a transparent substrate.

Another object of the invention is to employ a single external mask to fabricate vertically aligned electrode patterns on a transparent substrate.

These and other objects of the invention will become apparent to those skilled in the art upon consideration of the following description of the invention.

BRIEF SUMMARY OF THE INVENTION

The present invention is directed to a method for fabricating selected patterns of material on each of the upper and lower opposed surfaces of a substantially transparent substrate. In accordance with this method, a selected pattern of material is situated on the upper surface of the substrate. The lower surface of the substrate is coated with photoresist. The upper surface of the substrate is exposed to collimated light. The portions of the photoresist on the lower surface which were not exposed to light through the substrate are removed. The lower surface of the substrate is coated with a layer of selected material. The remaining portions of photoresist on the lower surface are removed to form a selected pattern of selected material on said lower surface substantially vertically aligned with the selected pattern of opaque material on the upper surface of the substrate.

The features of the invention believed to be novel are set forth with particularily in the appended claims. The invention itself, however, both as to organization and method of operation, together with further objects and advantages thereof, may best be understood by reference to the following description taken in conjunction with the accompanying drawings.

DESCRIPTION OF THE PREFERRED EMBODIMENTS

In accordance with the method of the present invention for fabricating selected aligned patterns on the upper and lower surfaces of a substantially transparent substrate, a layer of opaque material having a selected pattern is first situated on the upper surface of the transparent substrate. This step is well known in the art, but for sake of completeness is illustrated in FIGS. 1–5.

Figure 1:
FIG. 1 is a representation of a transparent substrate having an opaque coating on one surface thereof.

FIG. 1 is a substrate of transparent material 10, for example PLZT, upon the opposed surfaces of which it is desired to fabricate vertically aligned electrode patterns. A layer 20 of opaque material, for example metallic electrode material, is situated on the upper surface of substrate 10.

Figure 2:
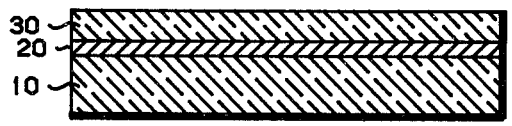
FIG. 2 shows the transparent substrate of FIG. 1 with a layer of photoresist situated on the opaque coating.
Figure 3:
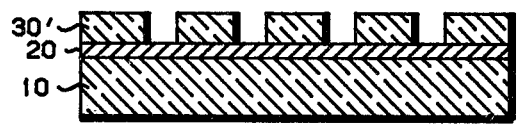
FIG. 3 shows the substrate of FIG. 2 after a selected pattern has been formed in the photoresist layer.
Figure 4:
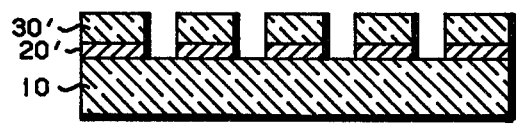
FIG. 4 shows the substrate of FIG. 3 after the selected pattern has been etched into the opaque coating.
Figure 5:
FIG. 5 shows the substrate of FIG. 4 after removal of the photoresist.

A layer 30 of photoresist is situated on opaque material 20 as shown in FIG. 2. A mask (not shown) exhibiting the desired selected pattern is situated on photoresist layer 30 and exposed to ultraviolet light or other light to which the selected photoresist is sensitive. Photoresist layer 30 is subsequently developed and baked at a temperature appropriate for the selected photoresist to form patterned photoresist layer 30' exhibiting the selected desired pattern shown in FIG. 3. Substrate 10 with layers 20 and 30' thereon is subjected to a chemical etchant to remove the portions of opaque layer 20 not protected by photoresist pattern 30' to form the structure shown in FIG. 4. A layer 20' of opaque material is thus formed on the upper surface of substrate 10 exhibiting the desired selected pattern as shown in FIG. 4. The remaining patterned layer 30' of photoresist is then removed leaving layer 20' of patterned opaque material on the upper surface of substrate 10 as shown in FIG. 5.

Figure 6:
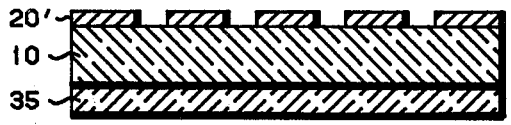
FIG. 6 shows the substrate of FIG. 5 after application of a layer of photoresist to the lower surface thereof.

To fabricate a layer of selected material on the lower surface of substrate 10 exhibiting a pattern substantially identical to and vertically aligned with the pattern of opaque material layer 20' on the upper surface of substrate 10, a layer of photoresist 35 is situated on the lower surface of substrate 10 as shown in FIG. 6.

Figure 7:
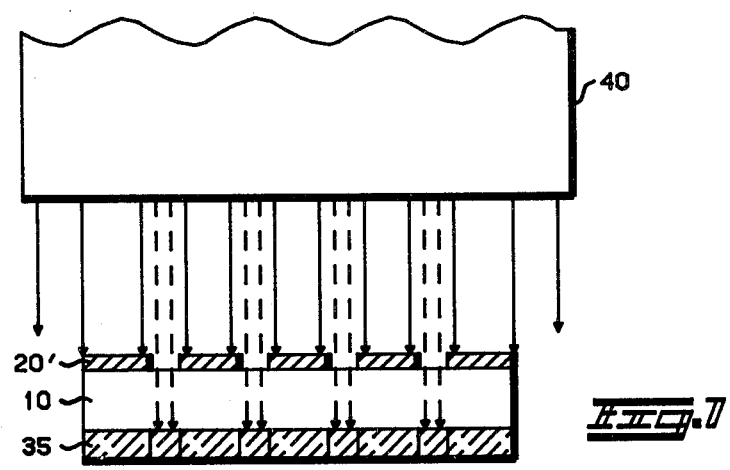
FIG. 7 is an illustration showing the photoresist on the lower surface of the substrate of FIG. 6 being exposed to a source of collimated light incident upon the upper surface of the substrate.
Figure 8:
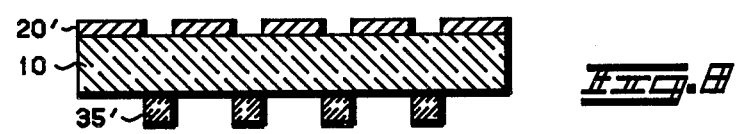
FIG. 8 shows the substrate of FIG. 7 after removal of the portions of the photoresist material on the lower surface of the substrate not exposed to light.

As shown in FIG. 7, the upper surface of substrate 10 with patterned opaque material layer 20' disposed thereon is exposed to a source of collimated light 40. The collimated light is positioned substantially perpendicular to the upper and lower surface of substrate 10. Light incident upon the layer 20' of opaque material is indicated as vertical arrow-like lines. Since only portions of the upper surface of substrate 10 are occupied by patterned opaque layer 20', some light passes through transparent substrate 10 and strikes photoresist layer 35 on the lower surface of substrate 10. Such light which impinges upon photoresist layer 35 is indicated as vertical dashed arrow-like lines. Photoresist layer 35 is comprised of negative working photoresists which chemically hardens when subjected to incident light, for example ultraviolet light. Thus, substantially only the portions of photoresist layer 35 immediately below the portions of the upper surface of substrate 10 not occupied by pattern layer 20' are exposed and hardened by light passing through substrate 10. The unexposed portions of photoresist layer 35 are chemically removed leaving patterned photoresist layer 35' on the lower surface of substrate 10 as shown in FIG. 8. To accomplish such removal, the development procedure appropriate for the selected photoresist is employed. More specifically, the unexposed portions of photoresist layer 35 are dissolved by the developer and are washed off substrate 10. Typical developers used for negative working photoresists such as layer 35 are 1, 1, 1 trichlorethane, Stoddard solvent and trichlorethylene.

Figure 9:
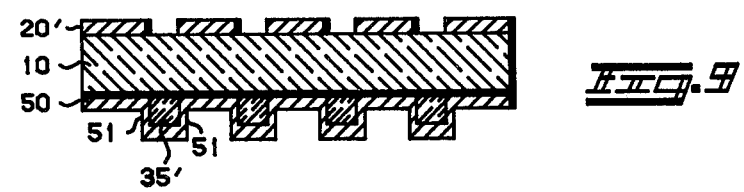
FIG. 9 shows the substrate of FIG. 8 after application of a layer of metallic material to the lower surface thereof.
Figure 10:
FIG. 10 shows the substrate of FIG. 9 after removal of the remaining portions of photoresist material on the lower surface of the substrate.

A layer of selected material 50, for example metallic electrode material, is applied to the lower surface of substrte 10 and photoresist layer 35' in FIG. 9. The patterned photoresist layer 35' is stripped away from substrate 10 by applying one of several known photoresist strippers to photoresist layer 35' through metallic electrode layer 50. Acceptable photoresist strippers are known mixtures of sulfuric acid and hydrogen peroxide as well as the solvent acetone. Such photoresist strippers dissolve the thin portions (e.g. portion 51) of metallic electrode layer 50 and chemically attack and strip away the photoresist layer portions 35' therebelow. (FIG. 9 is not drawn to scale and, as such, thin portions 51 are actually substantially thinner than as illustrated.) This stripping procedure leaves a layer 50' of selected material on the lower surface of substrate 10 having a pattern identical to and vertically aligned with the pattern of opaque material layer 20' on the upper surface of substrate 10. It is observed that PLZT electro-optic display devices are conveniently fabricated by employing metallic electrode material as layers 20 and 50 in the method of the invention discussed above.

The foregoing describes a method for fabricating substantially vertically aligned patterns on the opposed surfaces of a transparent substrate. The method of the invention conveniently employs a single external mask to generate such patterned layers.

While only certain preferred features of the invention have been shown by way of illustration, many modifications and changes will occur to those skilled in the art. It is, therefore, to be understood that the present claims are intended to cover all such modifications and changes as fall within the true spirit of the invention.

We claim:

1. A method for fabricating selected aligned metallic electrode patterns on the upper and lower surfaces of a substantially transparent substrate comprising the steps of:
   A. Situating an opaque metallic electrode material having a selected pattern on the upper surface of said substrate;
   B. Coating the lower surface of said substrate with photoresist;
   C. Exposing the upper surface of said substrate to collimated light so as to expose through said substrate the portions of the photoresist on the lower surface which remained unshielded by said opaque metallic electrode material on said upper surface;
   D. Removing the portions of the photoresist on said lower surface which was unexposed to light through the substrate;
   E. Coating said lower surface with a layer of selected metallic electrode material, and
   F. Removing the remaining portions of photoresist on said lower surface to form a selected pattern of selected metallic electrode material on said lower surface substantially vertically aligned with the selected pattern of opaque metallic electrode material on said upper surface.

2. The method of claim 1 wherein in said step A a selected pattern of metallic electrode material is situated on the upper surface of a PLZT substrate.

3. The method of claim 1 wherein in said step B the lower surface of said substrate is coated with a negative working photoresist.

4. The method of claim 1 wherein in said step C the upper surface of said substrate is exposed to collimated ultraviolet light.

* * * * *